(12) United States Patent
Zhang et al.

(10) Patent No.: US 10,656,234 B2
(45) Date of Patent: May 19, 2020

(54) ELECTROMAGNETIC FIELD PATTERN FOR PHASED ARRAY ANTENNA

(71) Applicant: THE BOEING COMPANY, Chicago, IL (US)

(72) Inventors: Henry Zhenhua Zhang, Bellevue, WA (US); Ryan Gene From, St. Peters, MO (US); Ruben Augusto Llamas, St. Charles, MO (US)

(73) Assignee: THE BOEING COMPANY, Chicago, IL (US)

(*) Notice: Subject to any disclaimer, the term of this patent is extended or adjusted under 35 U.S.C. 154(b) by 262 days.

(21) Appl. No.: 15/637,980

(22) Filed: Jun. 29, 2017

(65) Prior Publication Data
US 2019/0004139 A1   Jan. 3, 2019

(51) Int. Cl.
| | |
|---|---|
| *G01S 3/14* | (2006.01) |
| *G01R 29/10* | (2006.01) |
| *H01Q 1/52* | (2006.01) |
| *H01Q 3/26* | (2006.01) |
| *H01Q 21/28* | (2006.01) |
| *G01V 3/30* | (2006.01) |
| *G02B 5/18* | (2006.01) |
| *G02B 27/09* | (2006.01) |

(Continued)

(52) U.S. Cl.
CPC ............. *G01S 3/146* (2013.01); *G01R 29/10* (2013.01); *G01V 3/30* (2013.01); *G02B 5/1871* (2013.01); *G02B 27/09* (2013.01); *H01Q 1/243* (2013.01); *H01Q 1/288* (2013.01); *H01Q 1/38* (2013.01); *H01Q 1/521* (2013.01); *H01Q 3/267* (2013.01); *H01Q 21/28* (2013.01); *H01Q 1/28* (2013.01)

(58) Field of Classification Search
CPC ........ G01S 3/146; H01Q 21/28; H01Q 3/267; H01Q 1/521; G01R 29/10
USPC ........................................................ 342/360
See application file for complete search history.

(56) References Cited

U.S. PATENT DOCUMENTS

2013/0208332 A1* 8/2013 Yu ......................... H01Q 15/10
                                                          359/240

FOREIGN PATENT DOCUMENTS

EP           1267442 A1    12/2002

OTHER PUBLICATIONS

Extended European Search Report for Application No. 18176583.5 dated Nov. 19, 2018, 9 pgs.

(Continued)

*Primary Examiner* — Bo Fan
(74) *Attorney, Agent, or Firm* — Moore IP Law (57) ABSTRACT

A method includes determining, on an individual element-by-element basis, a normalized far-field pattern for each radiating element of a plurality of antenna elements. The plurality of antenna elements is associated with a phased array antenna. The method also includes determining an overall electromagnetic far-field pattern for the phased array antenna based on individual normalized element far-field patterns and based on beamforming parameters associated with a location of interest. The overall electromagnetic far-field pattern is usable to determine a signal strength, at the location of interest, of a signal transmitted from the phased array antenna. The method also includes determining an isolation between the phased array antenna and a secondary communication device based on the overall electromagnetic far-field pattern. The method further includes generating an output indicative of the isolation.

11 Claims, 7 Drawing Sheets

(51) Int. Cl.
     H01Q 1/24    (2006.01)
     H01Q 1/28    (2006.01)
     H01Q 1/38    (2006.01)

(56) References Cited

OTHER PUBLICATIONS

Malmstrom, Johan, et al., "Approximate methods to determine the isolation between antennas on vehicles," 2016 IEEE International Symposium on Antennas and Propagation (APSURSI), IEEE, Jun. 26, 2016, 2 pgs.

Rutschin, Marc, et al., "Phased antenna array design with CST Studio Suite", CST European User Conference 2016, <https://www.cst.com/-/media/files/euc2016-technical-sessions/6-1-2-marc_ruetsch]in.ashx> retrieved Nov. 9, 2018 [retrieved on Nov. 9, 2018], 37 pgs.

Rutschlin, Marc, et al., "State of the art antenna simulation with CST Studio Suite," 2015 9th European Conference on Antennas and Propagation (EUCAP), EURAAP,, 5 pgs.

Zhang, et al., "Rapid Antenna coupling Analysis Tool for Arbitrary Antennas Using UTD", 2012 IEEE Symposium on Antennas and Propagation, Jul. 8-14, 2012, 2 pages.

\* cited by examiner

ELECTROMAGNETIC FIELD PATTERN FOR PHASED ARRAY ANTENNA

FIELD OF THE DISCLOSURE

The present disclosure relates to the synthesis of electromagnetic field patterns for phased array antenna(s) with arbitrary beam forming and steering characteristics.

BACKGROUND

Communication systems installed on aircrafts, ships or even cars require electromagnetic compatibility and interference free operation. Additionally, within the aerospace industry, the Federal Aviation Administration (FAA) requires communication systems to comply with certain regulatory criteria mandating system interoperability. As a non-limiting example, aircraft systems may include primary transmitting/receiving equipment providing Air Traffic Control (ATC) communication or navigation services and secondary systems providing broadband entertainment services. As a result, FAA regulations require adequate antenna-to-antenna isolation (e.g., attenuation) between primary systems/devices providing ATC communication/navigation services (e.g., a navigation phased array antenna) and secondary communication device(s) (e.g., a second phased array antenna or a single antenna).

The isolation between the primary communication device (e.g., a primary phased array antenna) and the secondary communication device changes with the primary phased array antenna's beam forming and steering characteristics. An isolation assessment is not only based on the "worst-case" scenario, which assumes that the primary phased array antenna transmits a beam directly at the secondary communication device, but is also based on each possible beam shape and direction at the second communication device. This allows an FAA or a phased array antenna operator to setup a rule, place a mechanical/software stop, or change the design to restrict where the primary phased array antenna can be beamed to and what type of the beam shape is allowed. The "far-field pattern" is the electromagnetics term for the beam shape and direction of an antenna. The "overall far-field pattern" is designated to a phased array antenna's beam shape and direction in present disclosure. The overall far-field pattern is one parameter to determine the isolation between the primary phased array antenna and the second communication device. However, determining the overall far-field pattern is a time consuming and labor intensive process in the isolation calculation. There are many possible beam shapes and directions for a phased array antenna. It is difficult and time consuming to measure or calculate each possible overall far-field pattern (e.g., beam shape and direction).

SUMMARY

According to one implementation of the present disclosure, a method includes determining, on an individual element-by-element basis, a normalized far-field pattern for each radiating element of a plurality of antenna elements. The plurality of antenna elements is associated with a phased array antenna. The method also includes determining an overall electromagnetic far-field pattern for the phased array antenna based on individual normalized element far-field patterns and based on beamforming parameters associated with a location of interest. The overall electromagnetic far-field pattern is usable to determine a signal strength, at the location of interest, of a signal transmitted from the phased array antenna. The method also includes determining an isolation between the phased array antenna and a secondary communication device based on the overall electromagnetic far-field pattern. The method further includes generating an output indicative of the isolation.

According to another implementation of the present disclosure, a system includes a phased array antenna and a processor coupled to the phased array antenna. The phased array antenna includes a plurality of antenna elements. The processor is configured to determine, on an individual element-by-element basis, a normalized far-field pattern for each radiating element of the plurality of antenna elements. The processor is further configured to determine an overall electromagnetic far-field pattern for the phased array antenna based on individual normalized electromagnetic far-field patterns and based on beamforming parameters associated with a location of interest. The overall electromagnetic far-field pattern is usable to determine a signal strength, at the location of interest, of a signal transmitted from the phased array antenna. The processor is also configured to determine an isolation between the phased array antenna and a secondary communication device based on the overall electromagnetic far-field pattern. The processor is further configured to generate an output indicative of the isolation.

According to another implementation of the present disclosure, a non-transitory computer-readable medium includes instructions that, when executed by a processor, cause the processor to perform operations including determining, on an individual element-by-element basis, a normalized far-field pattern for each radiating element of a plurality of antenna elements. The plurality of antenna elements is associated with a phased array antenna. The operations also include determining an overall electromagnetic far-field pattern for the phased array antenna based on individual normalized element far-field patterns and based on beamforming parameters associated with a location of interest. The overall electromagnetic far-field pattern is usable to determine a signal strength, at the location of interest, of a signal transmitted from the phased array antenna. The operations also include determining an isolation between the phased array antenna and a secondary communication device based on the overall electromagnetic far-field pattern. The operations further include generating an output indicative of the isolation.

One advantage of the above-described implementation is that electromagnetic far-field patterns of individual elements of a phased array antenna can be determined one-by-one and summed to enable determination of the collective electromagnetic far-field pattern for different beams that the phased array antenna can generate. Accordingly, the element-by-element far-field patterns can be used to determine isolation between the phased array antenna at a location of interest and a secondary communication system. Additionally, the features, functions, and advantages that have been described can be achieved independently in various implementations or may be combined in yet other implementations, further details of which are disclosed with reference to the following description and drawings.

DETAILED DESCRIPTION

Particular embodiments of the present disclosure are described below with reference to the drawings. In the description, common features are designated by common reference numbers throughout the drawings.

The figures and the following description illustrate specific exemplary embodiments. It will be appreciated that those skilled in the art will be able to devise various arrangements that, although not explicitly described or shown herein, embody the principles described herein and are included within the scope of the claims that follow this description. Furthermore, any examples described herein are intended to aid in understanding the principles of the disclosure and are to be construed as being without limitation. As a result, this disclosure is not limited to the specific embodiments or examples described below, but by the claims and their equivalents.

The techniques described herein enable a processor (e.g., a simulator) to generate an overall electromagnetic far-field pattern (e.g., a far-field pattern for a phased array antenna) based on individual normalized element far-field patterns for each radiating element of a phased array antenna. For example, a phased array antenna simulator activates (e.g., excites) each antenna element of the phased array antenna individually by applying a normalized power and a normalized phase to each antenna element sequentially. While a particular antenna element is activated, one or more sensors measure, or calculate, a far-field pattern associated with the particular antenna element. After far-field patterns are measured or calculated for each antenna element of the phased array antenna, the overall electromagnetic far-field pattern of the phased array antenna device can be estimated by beamforming and summing the individual far-field patterns of the antenna elements. For example, the overall electromagnetic far-field pattern is based on each far-field pattern associated with the different antenna elements and beamforming parameters associated with the location of interest. The beamforming parameters include a power level and a phase for each antenna element to beam the phased array antenna to a location of interest. Additional details clarifying how the overall electromagnetic far-field pattern is determined are described below.

The overall electromagnetic far-field pattern with the given beamforming parameters can be used to determine (e.g., calculate) attenuation at a location of interest, an equivalent source current can be obtained through electromagnetic methods, such as Uniform Theory of Diffraction (UTD), antenna coupling between the phased array antenna device and another antenna device, etc. For example, antenna coupling can be used to determine whether the phased array antenna device with the given beamforming parameters is in compliance with standards and criteria set forth by the Federal Aviation Administration (FAA). To illustrate, the FAA requires adequate isolation and attenuation between communication devices (e.g., a phased array antenna device) providing broadband communication services on an aircraft and other antennas on the aircraft.

Figure 1:
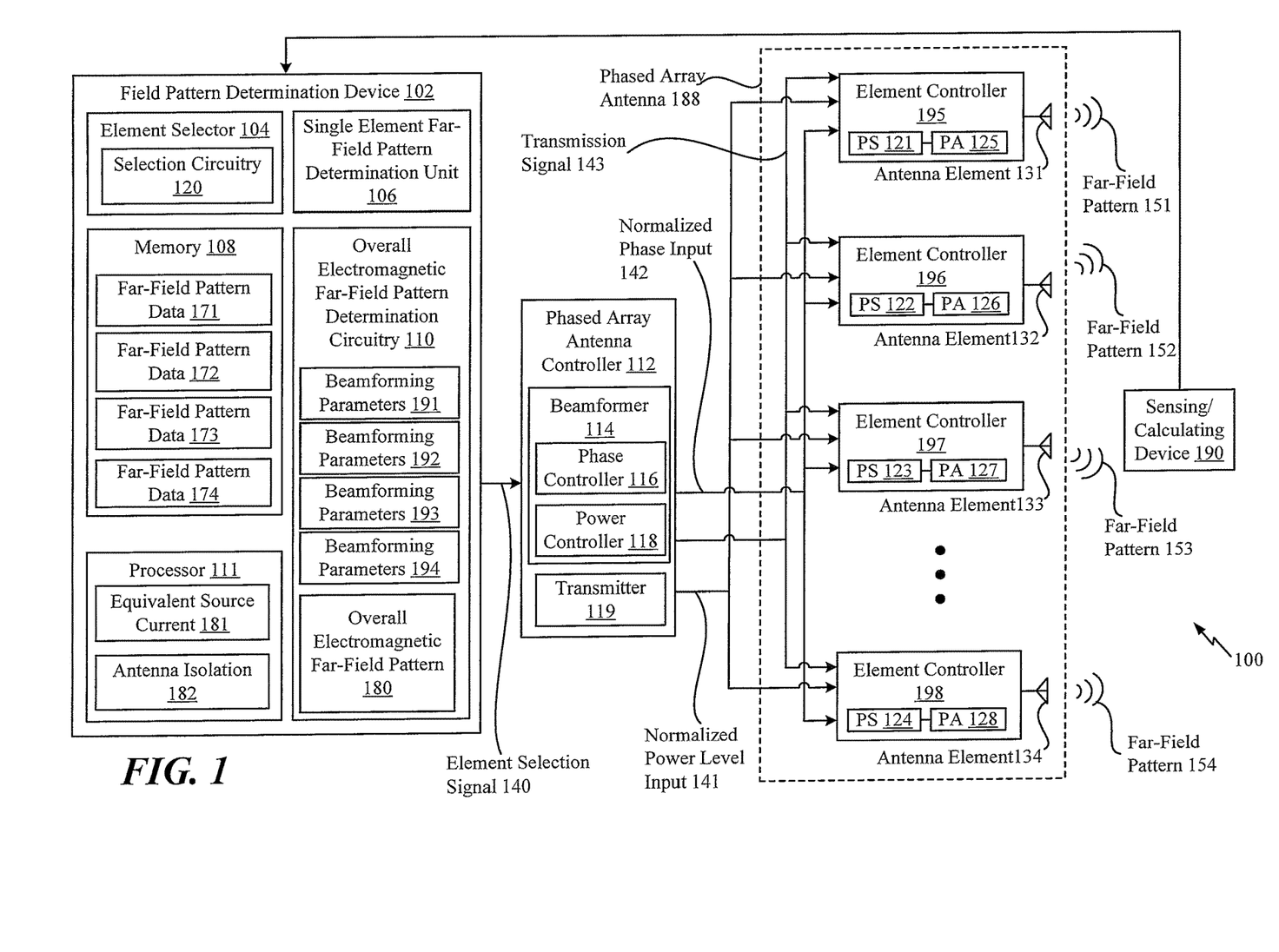
FIG. 1 is a diagram of a phased array antenna device that is operable to estimate an overall electromagnetic far-field pattern using element-by-element far-field pattern simulation.

FIG. 1 is a diagram of a system 100 that is operable to determine an element-by-element far-field pattern. The system 100 includes a field pattern determination device 102, a phased array antenna controller 112, a phased array antenna 188, and a sensing/calculating device 190. According to one implementation, the phased array antenna controller 112 and the phased array antenna 188 may be integrated into a first component of a carrier (e.g., an airplane, a ship, or a car). The field pattern determination device 102 and the sensing/calculating device 190 may be used to test the phased array antenna controller 112 and the phased array antenna 188 prior to aircraft/ship/car integration. For example, the phased array antenna 188 may be integrated into (e.g., included in) a communication device on an aircraft/ship/car after testing. As described with reference to FIG. 3, the phased array antenna 188 may be used to communicate with other antenna devices integrated into the aircraft/ship/car.

In FIG. 1, the field pattern determination device 102 includes an element selector 104, a single element far-field pattern determination unit 106, a memory 108, overall electromagnetic far-field pattern determination circuitry 110, and a processor 111. In other examples, the overall electromagnetic far-field pattern determination circuitry 110 and the processor 111 may be separate from the field pattern determination device 102. As described below, the element selector 104 includes selection circuitry 120 that is configured to generate an element selection signal 140 that initiates activation of a single antenna element of the phased array antenna 188. According to one implementation, the memory 108 is a non-transitory computer-readable medium that includes instructions (not shown) that are executable to cause one or more processing elements to perform the techniques described herein. For example, the instructions are executable to cause the one or more processing elements to perform functions associated with the process diagram 400 of FIG. 4, the method 500 of FIG. 5, or both. According to one example, the instructions may be executable by the processor described with reference to FIG. 6. The field pattern determination device 102 is communicatively coupled to the phased array antenna controller 112. The phased array antenna controller 112 includes a beamformer 114 and a transmitter 119. The beamformer 114 includes a phase controller 116 and a power controller 118.

The phased array antenna controller 112 is coupled to the phased array antenna 188. The phased array antenna 188 includes a plurality of element controllers and a plurality of antenna elements. For example, the phased array antenna 188 includes an element controller 195, an element controller 196, an element controller 197, and an element controller 198. The element controller 195 includes a phase shifter (PS) 121 coupled to a power amplifier (PA) 125, the element controller 196 includes a phase shifter 122 coupled to a power amplifier 126, the element controller 197 includes a phase shifter 123 coupled to a power amplifier 127, and the element controller 198 includes a phase shifter 124 coupled to a power amplifier 128. Each phase shifter 121-124 is coupled to receive one or more signals (e.g., phase input signals) from the phase controller 116, and each power amplifier 125-128 is coupled to receive one or more signals (e.g., power level input signals) from the power controller 118. Although four element controllers 195-198 are illustrated in FIG. 1, in other implementations, additional (or fewer) element controllers are included in the phased array antenna 188. As a non-limiting example, hundreds or thousands of element controllers may be included in the phased array antenna 188. The phased array antenna 188 also includes an antenna element 131 coupled to the element controller 195, an antenna element 132 coupled to the element controller 196, an antenna element 133 coupled to the element controller 197, and an antenna element 134 coupled to the element controller 198. Although four antenna elements 131-134 are illustrated in FIG. 1, in other implementations, additional (or fewer) antenna elements are included in the phased array antenna 188. As a non-limiting example, hundreds or thousands of antenna elements may be included in the phased array antenna 188.

The system 100 is configured to determine a far-field pattern 151-154 for each antenna element 131-134, respectively, on an element-by-element basis. For example, the system 100 activates (e.g., excites) each antenna element 131-134 one-by-one to determine the far-field pattern 151-154 for each antenna element 131-134, respectively. After determining each far-field pattern 151-154, an overall electromagnetic far-field pattern 180 of the phased array antenna 188 can be determined based on the far-field patterns 151-154 and beamforming parameters associated with a location of interest, as described below.

To illustrate, during operation, the element selector 104 initiates determination of the far-field pattern 151 for the antenna element 131. The selection circuitry 120 generates the element selection signal 140 indicating that the antenna element 131 is selected for activation and the other antenna elements 132-134 are selected for deactivation. The element selection signal 140 is provided to the phased array antenna controller 112. Based on the element selection signal 140, the phase controller 116 generates a normalized phase input 142 that adjusts a phase of the phase shifter 121 (coupled to the antenna element 131) to a normalized phase. As used herein, the "normalized phase" corresponds to a phase used by each phase shifter 121-124 to determine the far-field patterns 151-154. The phase controller 116 provides the normalized phase input 142 to the phase shifter 121. Additionally, upon receiving the element selection signal 140, the power controller 118 generates a normalized power level input 141 that adjusts a power level of the power amplifier 125 to a normalized power level. As used herein, the "normalized power level" corresponds to a power level provided to the power amplifiers 125-128 to determine the far-field patterns 151-154.

In response to receiving the normalized phase input 142 and the normalized power level input 141, the element controller 195 excites the antenna element 131 to generate the far-field pattern 151. The far-field pattern 151 is indicative of a radiation pattern, at a particular distance from the antenna element 131, of an electromagnetic field surrounding the antenna element 131.

Figure 2:
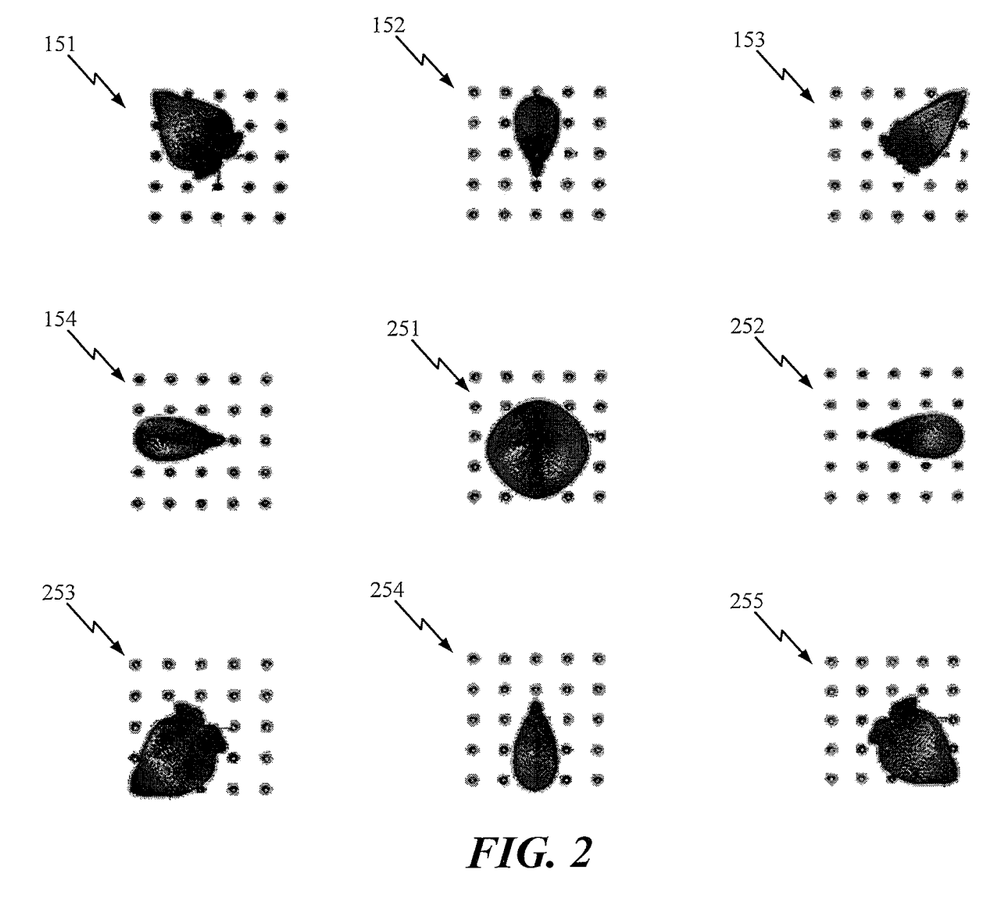
FIG. 2 depicts non-limiting examples of far-field patterns for single antenna elements.

Referring now to both FIG. 1 and FIG. 2, a non-limiting illustration of the far-field pattern 151 is shown (see FIG. 2). The sensing/calculating device 190 detects (e.g., senses/calculates) the far-field pattern 151 and provides an indication of the far-field pattern 151 to the single element far-field pattern determination unit 106. According to the implementation described above, the sensing/calculating device 190 is located the particular distance from the antenna element 131. If the sensing/calculating device 190 is calculating, the sensing/calculating device 190 can be a closed-box electromagnetic field simulator or an electromagnetic far-field calculator. The single element far-field pattern determination unit 106 generates far-field pattern data 171 for the antenna element 131 based on the indication of the far-field pattern 151 and stores the far-field pattern data 171 at the memory 108. During determination of the far-field pattern 151, the antenna elements 132-134 are not active.

Additionally, during operation, the element selector 104 initiates determination of the far-field pattern 152 for the antenna element 132. The selection circuitry 120 generates the element selection signal 140 indicating that the antenna element 132 is selected for activation and the other antenna elements 131, 133, 134 are selected for deactivation. The element selection signal 140 is provided to the phased array antenna controller 112. Based on the element selection signal 140, the phase controller 116 generates the normalized phase input 142 that adjusts a phase of the phase shifter 122 (coupled to the antenna element 132) to the normalized phase. The phase controller 116 provides the normalized phase input 142 to the phase shifter 122. Additionally, upon receiving the element selection signal 140, the power controller 118 generates the normalized power level input 141 that adjusts a power level of the power amplifier 126 to the normalized power level.

In response to receiving the normalized phase input 142 and the normalized power level input 141, the element controller 196 excites the antenna element 132 to generate the far-field pattern 152. Referring to FIG. 2, a non-limiting illustration of the far-field pattern 152 is shown. The sensing/calculating device 190 detects (e.g., senses or calculates) the far-field pattern 152 and provides an indication of the far-field pattern 152 to the single element far-field pattern determination unit 106. The single element far-field pattern determination unit 106 generates far-field pattern data 172 for the antenna element 132 based on the indication of the far-field pattern 152 and stores the far-field pattern data 172 at the memory 108. During determination of the far-field pattern 152, the antenna elements 131, 133, 134 are not active.

The element selector 104 also initiates determination of the far-field pattern 153 for the antenna element 133. The selection circuitry 120 generates the element selection signal 140 indicating that the antenna element 133 is selected for activation and the other antenna elements 131, 132, 134 are selected for deactivation. The element selection signal 140 is provided to the phased array antenna controller 112. Based on the element selection signal 140, the phase controller 116 generates the normalized phase input 142 that adjusts a phase of the phase shifter 123 (coupled to the antenna element 133) to the normalized phase. The phase controller 116 provides the normalized phase input 142 to the phase shifter 123. Additionally, upon receiving the element selection signal 140, the power controller 118 generates the normalized power level input 141 that adjusts a power level of the power amplifier 127 to the normalized power level.

In response to receiving the normalized phase input 142 and the normalized power level input 141, the element controller 197 excites the antenna element 133 to generate the far-field pattern 153. Referring to FIG. 2, a non-limiting illustration of the far-field pattern 153 is shown. The sensing/calculating device 190 detects (e.g., senses or calculates) the far-field pattern 153 and provides an indication of the far-field pattern 153 to the single element far-field pattern determination unit 106. The single element far-field pattern determination unit 106 generates far-field pattern data 173 for the antenna element 133 based on the indication of the far-field pattern 153 and stores the far-field pattern data 173 at the memory 108. During determination of the far-field pattern 153, the antenna elements 131, 132, 134 are not active.

The element selector 104 also initiates determination of the far-field pattern 154 for the antenna element 134. The selection circuitry 120 generates the element selection signal 140 indicating that the antenna element 134 is selected for activation and the other antenna elements 131, 132, 133 are selected for deactivation. The element selection signal 140 is provided to the phased array antenna controller 112. Upon receiving the element selection signal 140, the phase controller 116 generates the normalized phase input 142 that adjusts a phase of the phase shifter 124 (coupled to the antenna element 134) to the normalized phase. The phase controller 116 provides the normalized phase input 142 to the phase shifter 124. Additionally, upon receiving the element selection signal 140, the power controller 118 generates the normalized power level input 141 that adjusts a power level of the power amplifier 128 to the normalized power level.

In response to receiving the normalized phase input 142 and the normalized power level input 141, the element controller 198 excites the antenna element 134 to generate the far-field pattern 154. Referring to FIG. 2, a non-limiting illustration of the far-field pattern 154 is shown. Other examples of far-field patterns 251, 252, 253, 254, 255 are also depicted in FIG. 2. The other far-field patterns 251-255 represent far-field patterns of other antenna elements (not shown) in the phased array antenna 188. The sensing/calculating device 190 detects (e.g., senses or calculates) the far-field pattern 154 and provides an indication of the far-field pattern 154 to the single element far-field pattern determination unit 106. The single element far-field pattern determination unit 106 generates far-field pattern data 174 for the antenna element 134 based on the indication of the far-field pattern 154 and stores the far-field pattern data 174 at the memory 108. During determination of the far-field pattern 154, the antenna elements 131-133 are not active.

Figure 3:
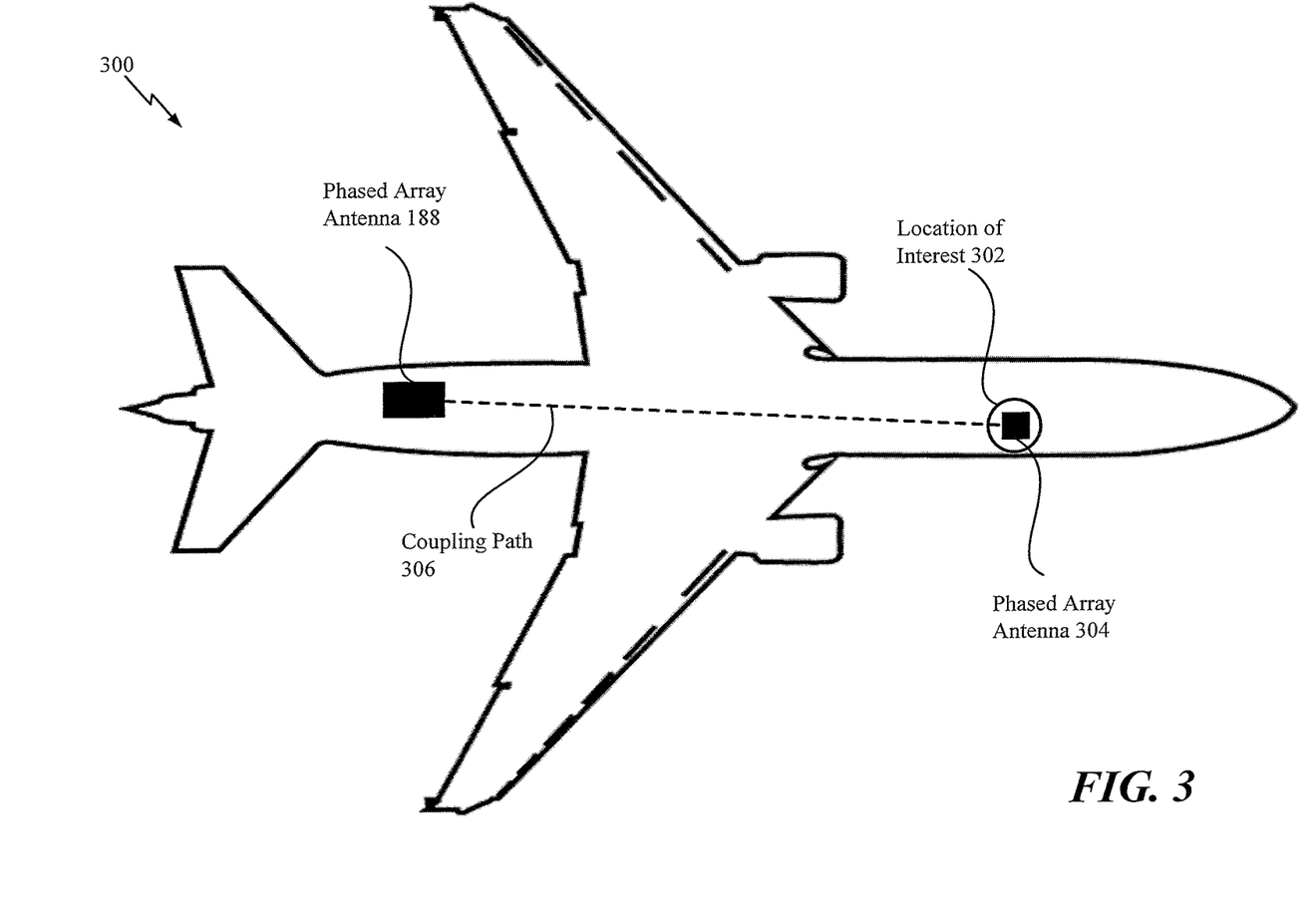
FIG. 3 depicts a non-limiting example of an aircraft that includes the phased array antenna of FIG. 1 and a second phased array antenna.

After the far-field pattern data 171-174 is determined for each antenna element 131-134, respectively, the overall electromagnetic far-field pattern determination circuitry 110 can determine the overall electromagnetic far-field pattern 180 for the phased array antenna 188. The overall electromagnetic far-field pattern for the phased array antenna 188 is determined based on each far-field pattern 151-154 and based on beamforming parameters 191, 192, 193, 194 associated with a location of interest, as depicted in FIG. 3. For example, referring to FIG. 3, a particular example of an aircraft 300 is shown. The aircraft 300 includes the phased array antenna 188 and another phased array antenna 304 located at a location of interest 302. The beamforming parameters 191-194 include power levels and phase inputs to be applied to each antenna element 131-134 to transmit a signal to the location of interest 302. For example, the beamforming parameters 191-194 include power levels and phase inputs to be applied to the element controllers 195-198 so that the transmitter 119 may transmit a transmission signal 143 to the location of interest 302.

Referring back to FIG. 1, the overall electromagnetic far-field pattern determination circuitry 110 determines a set of beamforming parameters 191 for the antenna element 131, a set of beamforming parameters 192 for the antenna element 131, a set of beamforming parameters 193 for the antenna element 133, and a set of beamforming parameters 194 for the antenna element 134. The set of beamforming parameters 191 include a power level to be applied to the power amplifier 125 to transmit signals towards the location of interest 302 and a phase input to be applied to the phase shifter 121 to transmit signals towards the location of interest 302. The set of beamforming parameters 192 include a power level to be applied to the power amplifier 126 to transmit signals towards the location of interest 302 and a phase input to be applied to the phase shifter 122 to transmit signals towards the location of interest 302. The set of beamforming parameters 193 include a power level to be applied to the power amplifier 127 to transmit signals towards the location of interest 302 and a phase input to be applied to the phase shifter 123 to transmit signals towards the location of interest 302, and the set of beamforming parameters 194 include a power level to be applied to the power amplifier 128 to transmit signals towards the location of interest 302 and a phase input to be applied to the phase shifter 124 to transmit signals towards the location of interest 302.

The overall electromagnetic far-field pattern 180 is expressed as:

$$\vec{E}(\theta,\varnothing,f) = \sum_{i=1}^{N} A_i(f)\vec{e}_i(\theta,\varnothing,f)\exp(-j\beta_i(f)), \quad \text{(Equation 1)}$$

where $\vec{E}$ corresponds to the overall electromagnetic far-field pattern 180, where $A_i$ corresponds to the power level for a particular antenna element 131-134, where $\vec{e}_i$ corresponds to the far-field pattern 151-154 for the particular antenna element 131-134, where $\beta_i$ corresponds to the phase input for the particular antenna element 131-134, where N is the number of antenna elements, where f is the frequency, and where $\theta$ and $\varnothing$ are spherical coordinates for the direction of the field. According to the described implementation, N is equal to four. However, it should be understood that N may be any integer value greater than one. Thus, determining the overall electromagnetic far-field pattern 180 includes adding a first electromagnetic far-field pattern (e.g., $A_1(f)\vec{e}_1(\theta, \varnothing, f)\exp(-j\beta_1(f))$), a second electromagnetic far-field pattern ((e.g., $A_2(f)\vec{e}_2(\theta, \varnothing, f)\exp(-j\beta_2(f))$)), a third electromagnetic far-field pattern (e.g., $A_3(f)\vec{e}_3(\theta, \varnothing, f)\exp(-j\beta_3(f))$)), and a fourth electromagnetic far-field pattern (e.g., $A_4(f)\vec{e}_4(\theta, \varnothing, f)\exp(-j\beta_4(f))$)).

The first electromagnetic far-field pattern is based on a product of the power level ($A_1$) associated with the beamforming parameters 191 and the far-field pattern ($\vec{e}_1$) 151 exponentially adjusted by the phase input ($\exp(-j\beta_1)$) associated with beamforming parameters 191. The second electromagnetic far-field pattern is based on a product of the power level ($A_2$) associated with the beamforming parameters 192 and the far-field pattern ($\vec{e}_2$) 152 exponentially adjusted by the phase input ($\exp(-j\beta_2)$) associated with beamforming parameters 192. The third electromagnetic far-field pattern is based on a product of the power level ($A_3$) associated with the beamforming parameters 193 and the far-field pattern ($\vec{e}_3$) 153 exponentially adjusted by the phase input ($\exp(-j\beta_3)$) associated with beamforming parameters 193, and the fourth electromagnetic far-field pattern is based on a product of the power level ($A_4$) associated with the beamforming parameters 194 and the far-field pattern ($\vec{e}_4$) 154 exponentially adjusted by the phase input ($\exp(-j\beta_4)$) associated with beamforming parameters 194.

After determining the overall electromagnetic far-field pattern 180, the processor 111 determines, based on the overall electromagnetic far-field pattern 180, an isolation (e.g., an antenna isolation 182) between the phased array antenna 188 and the phased array antenna 304 at the location of interest 302. For example, the processor 111 coverts the overall electromagnetic far-field pattern to an equivalent source current 181 using an electromagnetic method, such as Uniform Theory of Diffraction (UTD). The processor 111 also determines the antenna isolation 182 based on the equivalent source current 181. The processor also generates an output indicative of the isolation.

The techniques described with respect to FIGS. 1-3 enable the field pattern determination device 102 to determine the far-field patterns 151-154 of each of the antenna elements 131-134, respectively, one-by-one. The far-field patterns 151-154 are used to determine the overall electromagnetic far-field pattern 180 of the phased array antenna 188 for different beams that the phased array antenna 188 generates. Accordingly, the element-by-element field patterns may be used to determine isolation between the phased array antenna 188 and any location of interest (e.g., the location of interest 302). The isolation may be used to verify that the phased array antenna 188 is in compliance with applicable standards, such as FAA standards.

Figure 4:
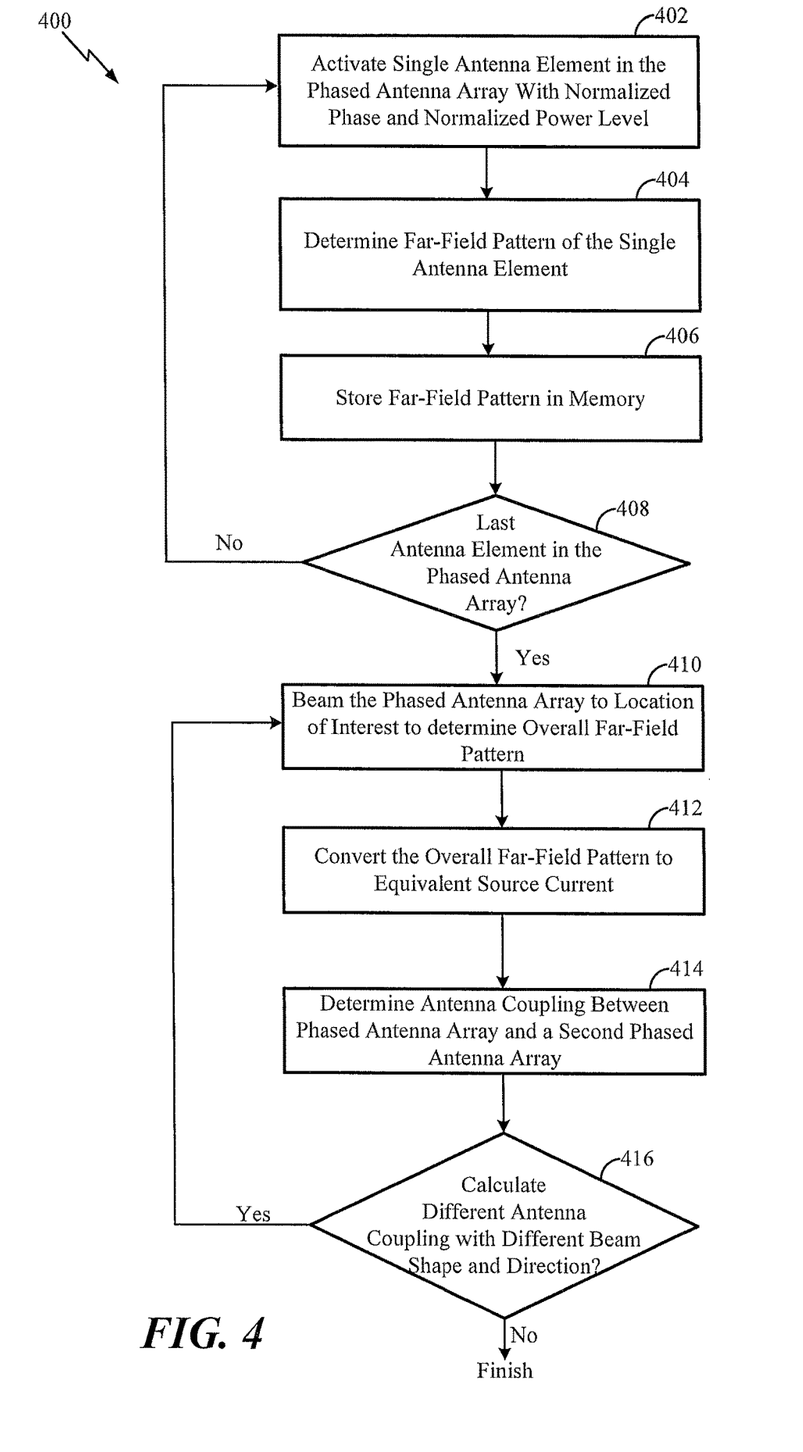
FIG. 4 is a process diagram for determining antenna coupling between phased antenna arrays.

Referring to FIG. 4, a process diagram 400 for determining antenna coupling between phase antenna arrays is shown. Operations associated with the process diagram 400 are performed by one or more components of the system 100 of FIG. 1.

At 402, a single antenna element in a phased antenna array is activated (e.g., excited) with a normalized phase and a normalized power level. For example, referring to FIG. 1, the phase controller 116 provide the normalized phase input 142 to the phase shifter 121 coupled to the antenna element 131, and the power controller 118 provides the normalized power level input 141 to the power amplifier 125 coupled to the antenna element 131. In response to receiving the normalized phase input 142 and the normalized power level input 141, the element controller 195 excites the antenna element 131 to generate the far-field pattern 151.

At 404, a far-field pattern of the single antemia element is determined (e.g., measured). For example, referring to FIG. 1, the sensing/calculating device 190 detects (e.g., senses or calculates) the far-field pattern 151 and provide an indication of the far-field pattern 151 to the single element far-field pattern determination unit 106.

At 406, the far-field pattern is stored in memory. For example, referring to FIG. 1, the single element far-field pattern determination unit 106 generates far-field pattern data 171 for the antenna element 131 based on the indication of the far-field pattern 151 and stores the far-field pattern data 171 at the memory 108.

At 408, a determination of whether the single antenna element is the last antenna element in the phase antenna array is made. If the single antenna element is not the last antenna element, another antenna element is activated, at 402. For example, the normalized phase and the normalized power level are provided to the element controller 196 to activate the antenna element 132. The far-field pattern 152 for the antenna element 132 is determined and stored in the memory 108, etc.

If the single antenna element is the last antenna element, the phase antenna array is beamed to a location of interest to determine an overall electromagnetic far-field pattern, at 410. For example, referring to FIGS. 1 and 3, the phased array antenna 188 may beam to the location of interest 302 to determine the overall electromagnetic far-field pattern 180 (e.g., the overall far-field pattern). User inputs for an elevation and azimuth angles are assigned to determine the beamforming parameters (e.g., the phase and power for each antenna element in Equation 1).

At 412, the overall electromagnetic far-field pattern is converted to an equivalent source current through an electromagnetic algorithm, such as Uniform Theory of Diffraction (UTD). For example, referring to FIG. 1, the processor 111 converts the overall electromagnetic far-field pattern 180 to the equivalent source current 181.

At 414, an antenna coupling between the phased antenna array and a second communication device is determined using, but not limited to, Geometrical Theory of Diffraction (GTD)/Uniform Theory of Diffraction (UTD) techniques. For example, referring to FIGS. 1 and 3, the system 100 determines the antenna coupling along the coupling path 306 based on the equivalent source current 181. The antenna coupling determination is based on decomposed geometry characteristics associated with a user-specified computational electromagnetic domain. The antenna coupling is converted to engineering units.

At 416, if there are other locations of interest (or other communication devices), the process diagram 400 beams the phased array antenna 188 to the other locations of interest to determine corresponding antenna couplings. Otherwise, the process diagram 400 ends.

Figure 5:
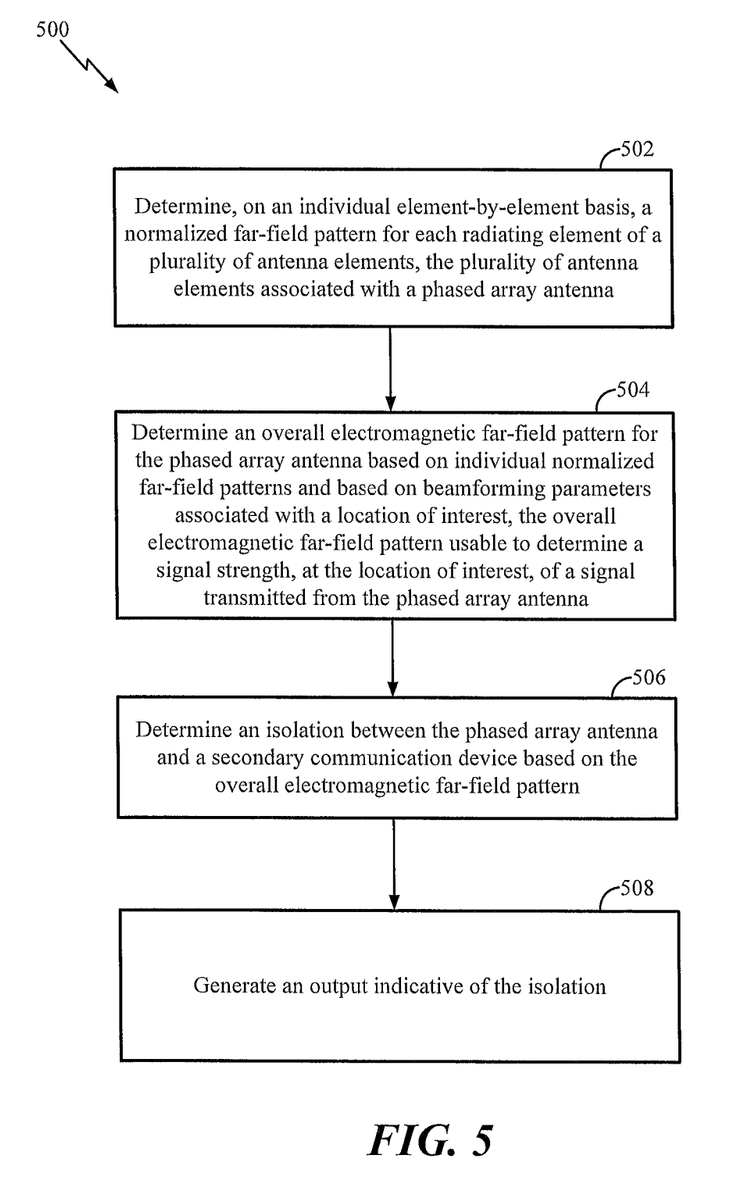
FIG. 5 is a method for determining an overall electromagnetic far-field pattern using element-by-element far-field pattern simulation.

Referring to FIG. 5, a method 500 for estimating an overall electromagnetic far-field pattern using element-by-element far-field pattern simulation is shown. The method 500 is performed by the one or more components of the system 100 of FIG. 1.

The method 500 includes determining, on an individual element-by-element basis, a normalized far-field pattern for each radiating element of a plurality of antenna elements, at 502. The plurality of antenna elements is associated with a phased array antenna. For example, referring to FIG. 1, the single element far-field pattern determination unit 106 determines the far-field patterns 151-154 for each antenna element 131-134, respectively, on an element-by-element basis. Determining the far-field pattern for each antenna element includes simulation the far-field pattern for each antenna element or measuring the far-field pattern for each antenna element.

According to one implementation, determining the far-field pattern for each antenna element includes activating a first antenna element of the plurality of antenna elements at a first time to determine a first far-field pattern for the first antenna element. Activating the first antenna element to determine the first far-field pattern includes applying a normalized power level to a first power amplifier that is coupled to the first antenna element and applying a normalized phase input to a first phase shifter that is coupled to the first antenna element. For example, referring to FIG. 1, the power controller 118 applies the normalized power level input 141 to the power amplifier 125 coupled to the antenna element 131, and the phase controller 116 applies the normalized phase input 142 to the phase shifter 121 coupled to the antenna element 131.

Determining the far-field pattern for each antenna element also includes activating a second antenna element of the plurality of antenna elements at a second time to determine a second far-field pattern for the second antenna element. Activating the second antenna element to determine the second far-field pattern includes applying the normalized power level to a second power amplifier that is coupled to the second antenna element and applying the normalized phase input to a second phase shifter that is coupled to the second antenna element. For example, referring to FIG. 1, the power controller 118 applies the normalized power level input 141 to the power amplifier 126 coupled to the antenna element 132, and the phase controller 116 applies the normalized phase input 142 to the phase shifter 122 coupled to the antenna element 132.

The method 500 also includes determining an overall electromagnetic far-field pattern for the phased array antenna based on individual normalized far-field patterns and based on beamforming parameters associated with a location of interest, at 504. For example, the overall electromagnetic far-field pattern determination circuitry 110 determines the overall electromagnetic far-field pattern 180 based on the far-field patterns 151-154 and the beamforming parameters 191-194. The overall electromagnetic far-field pattern 180 is expressed as:

$$\vec{E}(\theta,\emptyset,f)=\Sigma_{i=1}^{N}A_i(f)\vec{e}_i(\theta,\emptyset,f)\exp(-j\beta_i(f)), \quad \text{(Equation 1)}$$

where $\vec{E}$ corresponds to the overall electromagnetic far-field pattern 180, where $A_i$ corresponds to the power level for a particular antenna element 131-134, where $\vec{e}_i$ corresponds to the far-field pattern 151-154 for the particular antenna element 131-134, where $\beta_i$ corresponds to the phase input for the particular antenna element 131-134, where N is the number of antenna elements, where f is the frequency, and where $\theta$ and $\emptyset$ are spherical coordinates for the direction of the field. Thus, determining the overall electromagnetic far-field pattern 180 includes adding a first electromagnetic far-field pattern (e.g., $A_1(f)\vec{e}_1(\theta, \emptyset, f)\exp(-j\beta_1(f))$), a second electromagnetic far-field pattern ((e.g., $A_2(f)\vec{e}_2(\theta, \emptyset, f)\exp(-j\beta_2(f))$)), a third electromagnetic far-field pattern (e.g., $A_3(f)\vec{e}_3(\theta, \emptyset, f)\exp(-j\beta_3(f))$), and a fourth electromagnetic far-field pattern (e.g., $A_4(f)\vec{e}_4(\theta, \emptyset, f)\exp(-j\beta_4(f))$).

The first electromagnetic field pattern is based on a product of the power level ($A_2$) associated with the beamforming parameters 191 and the far-field pattern ($\vec{e}_1$) 151 exponentially adjusted by the phase input ($\exp(-j\beta_1)$) associated with beamforming parameters 191. The second electromagnetic far-field pattern is based on a product of the power level ($A_2$) associated with the beamforming parameters 192 and the far-field pattern ($\vec{e}_2$) 152 exponentially adjusted by the phase input ($\exp(-j\beta_2)$) associated with beamforming parameters 192. The third electromagnetic far-field pattern is based on a product of the power level ($A_3$) associated with the beamforming parameters 193 and the far-field pattern ($\vec{e}_3$) 153 exponentially adjusted by the phase input ($\exp(-j\beta_3)$) associated with beamforming parameters 193, and the fourth electromagnetic far-field pattern is based on a product of the power level ($A_4$) associated with the beamforming parameters 194 and the far-field pattern ($\vec{e}_4$) 154 exponentially adjusted by the phase input ($\exp(-j\beta_4)$) associated with beamforming parameters 194.

The method 500 also includes determining an isolation between the phased array antenna and a secondary communication device based on the overall electromagnetic far-field pattern, at 506. For example, referring to FIG. 1, the processor 111 determines the antenna isolation 182 based on the overall electromagnetic far-field pattern 180. The method 500 also includes generating an output indicative of the isolation, at 508. For example, referring to FIG. 1, the processor 111 generates an output indicative of the antenna isolation 182.

The method 500 of FIG. 5 enables the field pattern determination device 102 to determine the far-field patterns 151-154 of the antenna elements 131-134, respectively, one-by-one. The far-field patterns 151-154 are used to determine the overall electromagnetic far-field pattern 180 of the phased array antenna 188 for different beams that the phased array antenna 188 generates. Accordingly, the element-by-element field patterns may be used to determine isolation between the phased array antenna 188 and any location of interest (e.g., the location of interest 302). The isolation may be used to verify that the phased array antenna 188 is in compliance with applicable standards, such as FAA standards.

Figure 6:
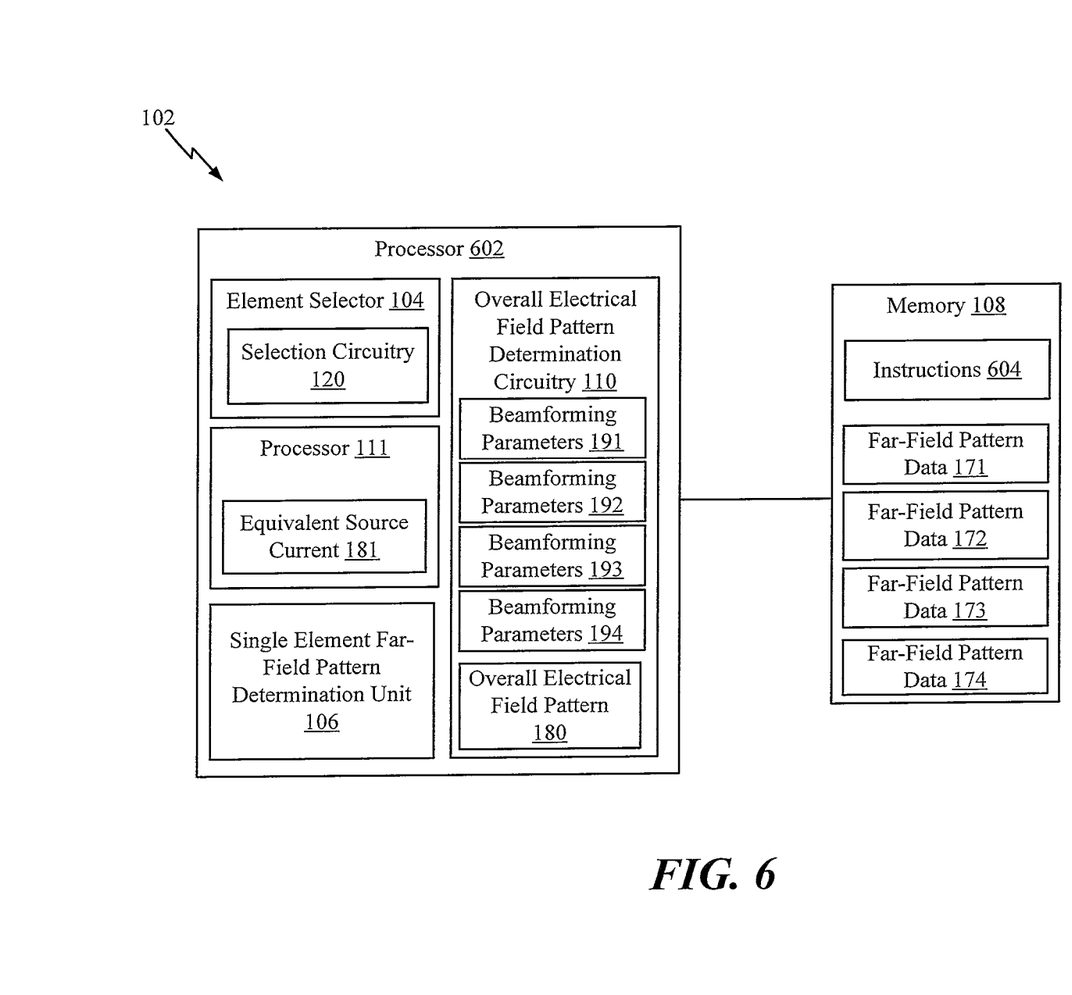
FIG. 6 depicts a non-limiting example of the field pattern determination device of FIG. 1.

Referring to FIG. 6, an example of the field pattern determination device 102 is shown. The field pattern determination device 102 includes a processor 602 coupled to the memory 108. The processor 602 includes the element selector 104, the single element far-field pattern determination unit 106, the overall electromagnetic far-field pattern determination circuitry 110, and the processor 111.

The memory 108 is a non-transitory computer-readable medium that includes instructions 604 that are executable by the processor 602. For example, the memory 108 stores instructions 604 that are executable by the processor 602 to perform the operations described with respect to the process diagram 400 of FIG. 4 and the method 500 of FIG. 5.

To illustrate, the instructions 604 are executable to cause the processor 602 to determine, on an element-by-element basis, a far-field pattern for each antenna element 131-134 of the plurality of antenna elements. The instructions 604 are also executable to cause the processor 602 to determine the overall electromagnetic far-field pattern 180 based on the beamforming parameters 191-194 associated with the location of interest 302. The instructions 604 are further executable to cause the processor 602 to determine the antenna isolation 182 between the phased array antenna 188 and another communication device based on the overall electromagnetic far-field pattern 180. The instructions 604 are further executable to cause the processor 602 to generate an output indicative of the antenna isolation 182.

Figure 7:
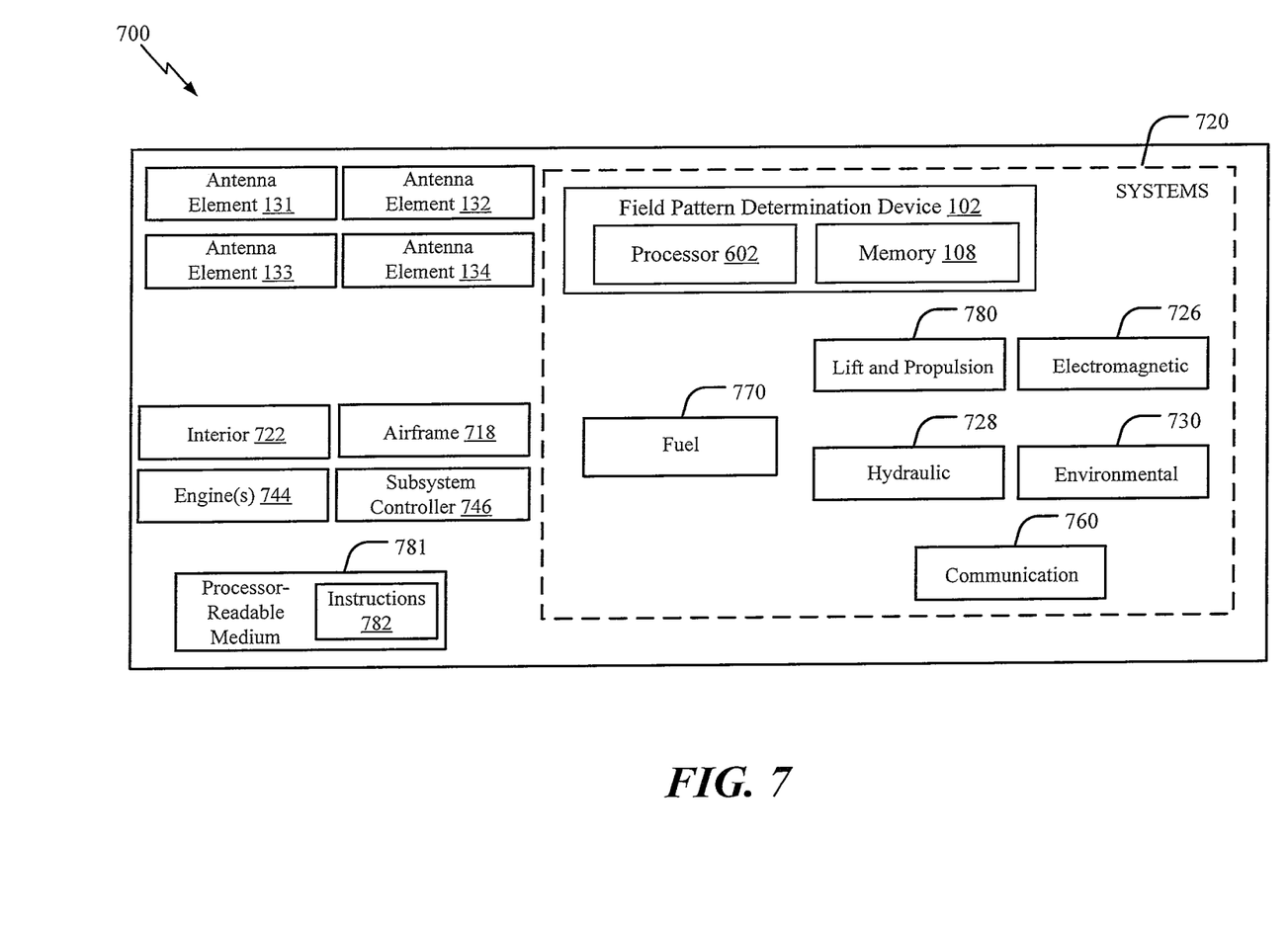
FIG. 7 depicts a non-limiting example of an aircraft that includes circuitry operable to determine an overall electromagnetic far-field pattern using element-by-element far-field pattern simulation.

Referring to FIG. 7, a block diagram of an illustrative embodiment of an aircraft 700 that includes the field pattern determination device 102 is shown. As shown in FIG. 7, the aircraft 700 may include an airframe 718, an interior 722, one or more engines 744, a subsystem controller 746, a non-transitory processor-readable medium 781 storing instructions 782, and a plurality of systems 720. The systems 720 may include one or more of a lift and propulsion system 780, an electromagnetic system 726, a hydraulic system 728, an enviromnental system 730, the field pattern determination device 102 that includes the processor 602 and the memory 108, a communication system 760, and a fuel system 770. Any number of other systems may be included. The one or more engines 744 may be part of the lift and propulsion system 780.

The instructions 782, when executed by the processor 602, may cause the processor 602 to perform any of the functions described above. For example, the instructions 782, when executed by the processor 602, may cause the processor 602 to determine, on an element-by-element basis, a far-field pattern for each antenna element 131-134 of the plurality of antenna elements. The instructions 782 are also executable to cause the processor 602 to determine the overall electromagnetic far-field pattern 180 based on the beamforming parameters 191-194 associated with a location of interest, such as the location of interest 302 in FIG. 3. The instructions 782 are further executable to cause the processor 602 to determine the antenna isolation 182 between the phased array antenna 188 and another communication device based on the overall electromagnetic far-field pattern 180. The instructions 782 are further executable to cause the processor 602 to generate an output indicative of the antenna isolation 182.

The illustrations of the examples described herein are intended to provide a general understanding of the structure of the various implementations. The illustrations are not intended to serve as a complete description of all of the elements and features of apparatus and systems that utilize the structures or methods described herein. Many other implementations may be apparent to those of skill in the art upon reviewing the disclosure. Other implementations may be utilized and derived from the disclosure, such that structural and logical substitutions and changes may be made without departing from the scope of the disclosure. For example, method operations may be performed in a different order than shown in the figures or one or more method operations may be omitted. Accordingly, the disclosure and the figures are to be regarded as illustrative rather than restrictive.

Moreover, although specific examples have been illustrated and described herein, it should be appreciated that any subsequent arrangement designed to achieve the same or similar results may be substituted for the specific implementations shown. This disclosure is intended to cover any and all subsequent adaptations or variations of various implementations. Combinations of the above implementations, and other implementations not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features may be grouped together or described in a single implementation for the purpose of streamlining the disclosure. Examples described above illustrate but do not limit the disclosure. It should also be understood that numerous modifications and variations are possible in accordance with the principles of the present disclosure. As the following claims reflect, the claimed subject matter may be directed to less than all of the features of any of the disclosed examples. Accordingly, the scope of the disclosure is defined by the following claims and their equivalents.

What is claimed is:

1. A system comprising:
   a far-field pattern sensor configured to generate far-field pattern data; and
   a processor coupled to the far-field pattern sensor and configured to couple to a phased array antenna comprising a plurality of antenna elements, the processor configured to:
   cause the phased array antenna to excite one antenna element at a time, to generate, on an individual element-by-element basis, a normalized far-field pattern for each radiating element of the plurality of antenna elements;
   receive, from the far-field pattern sensor, element-specific far-field pattern data for each antenna element of the phased array antenna, the element-specific far-field pattern data for a particular antenna element indicating an individual normalized element far-field pattern for the antenna element;
   determine, for a location of interest, an overall electromagnetic far-field pattern for the phased array antenna based on individual normalized element far-field patterns for each of the antenna elements and based on beamforming parameters associated with the location of interest;
   determine an isolation between the phased array antenna and a secondary communication device based on the overall electromagnetic far-field pattern; and
   generate an output indicative of the isolation.

2. The system of claim 1, wherein the plurality of antenna elements comprises at least a first antenna element and a second antenna element, and wherein the processor is further configured to:
   activate the first antenna element at a first time to generate, at the far-field pattern sensor, a first far-field pattern for the first antenna element;
   responsive to the first far-field pattern, receive from the far-field pattern sensor, first far-field pattern data indicating a first individual normalized element far-field pattern for the first antenna element;
   activate the second antenna element at a second time to generate, at the far-field pattern sensor, a second far-field pattern for the second antenna element; and
   responsive to the second far-field pattern, receive from the far-field pattern sensor, second far-field pattern data indicating a second individual normalized element far-field pattern for the second antenna element.

3. The system of claim 2, wherein, to activate the first antenna element at the first time, the processor is configured to:
   apply a normalized power level to a first power amplifier that is coupled to the first antenna element; and
   apply a normalized phase input to a first phase shifter that is coupled to the first antenna element.

4. The system of claim 3, wherein, to activate the second antenna element at the second time, the processor is configured to:
   apply the normalized power level to a second power amplifier that is coupled to the second antenna element; and
   apply the normalized phase input to a second phase shifter that is coupled to the first second antenna element.

5. The system of claim 1, wherein, after determination of the overall electromagnetic far-field pattern for the location of interest, the processor is further configured to:
   determine, for a second location of interest, a second overall electromagnetic far-field pattern for the phased array antenna based on the individual normalized element far-field patterns for each of the antenna elements and based on second beamforming parameters associated with the second location of interest;
   determine a second isolation between the phased array antenna and another secondary communication device based on the second overall electromagnetic far-field pattern; and
   generate an output indicative of the second isolation.

6. The system of claim 1, further comprising a memory coupled to the processor, wherein the processor is further configured to store the element-specific far-field pattern data for each antenna element of the phased array antenna in the memory.

7. The system of claim 4, wherein the processor is configured to sum the first and second individual normalized element far-field patterns to determine the overall electromagnetic far-field pattern, wherein the first individual normalized element far-field pattern is based on a product of the normalized power level and the first far-field pattern exponentially adjusted by the normalized phase input, and the second individual normalized element far-field pattern is based on a product of the normalized power level and the second far-field pattern exponentially adjusted by the normalized phase input.

8. A non-transitory computer-readable medium comprising instructions that, when executed by a processor, cause the processor to perform operations comprising:

causing a phased array antenna to excite one antenna element at a time to generate, on an individual element-by-element basis, a normalized far-field pattern for each radiating element of a plurality of antenna elements, of the phased array antenna;

receiving, from a far-field pattern sensor, element-specific far-field pattern data for each antenna element of the phased array antenna, the element-specific far-field pattern data for a particular antenna element indicating an individual normalized element far-field pattern for the antenna element;

determining, for a location of interest, an overall electromagnetic far-field pattern for the phased array antenna based on individual normalized element far-field patterns and based on beamforming parameters associated with the location of interest;

determining an isolation between the phased array antenna and a secondary communication device based on the overall electromagnetic far-field pattern; and generating an output indicative of the isolation.

9. The non-transitory computer-readable medium of claim 8, wherein generating the individual normalized element far-field pattern for each antenna element comprises:

activating a first antenna element of the plurality of antenna elements at a first time to determine a first far-field pattern for the first antenna element; and activating a second antenna element of the plurality of antenna elements at a second time to determine a second far-field pattern for the second antenna element.

10. The non-transitory computer-readable medium of claim 9, wherein the beamforming parameters comprise at least a first set of beamforming parameters associated with the first antenna element and a second set of beamforming parameters associated with the second antenna element.

11. The non-transitory computer-readable medium of claim 8, wherein causing the phased array antenna to excite one antenna element at a time comprises sending an element selection signal to a phased array antenna controller of the phase array antenna.

* * * * *

UNITED STATES PATENT AND TRADEMARK OFFICE
CERTIFICATE OF CORRECTION

PATENT NO. : 10,656,234 B2
APPLICATION NO. : 15/637980
DATED : May 19, 2020
INVENTOR(S) : Henry Zhenhua Zhang, Ryan Gene From and Ruben Augusto Llmas It is certified that error appears in the above-identified patent and that said Letters Patent is hereby corrected as shown below:

In the Claims

Column 14, Claim 4, Line 40, after "is coupled to the" delete "first".

Signed and Sealed this
Twenty-eighth Day of July, 2020

Andrei Iancu
*Director of the United States Patent and Trademark Office*